(12) United States Patent
Chen et al.

(10) Patent No.: US 11,009,069 B1
(45) Date of Patent: May 18, 2021

(54) SLIDE RAIL MECHANISM

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/824,714

(22) Filed: Mar. 20, 2020

(30) Foreign Application Priority Data

Nov. 19, 2019 (TW) .................................. 108142244

(51) Int. Cl.
| | |
|---|---|
| *A47B 88/00* | (2017.01) |
| *F16C 29/04* | (2006.01) |
| *F16C 29/00* | (2006.01) |
| *F16C 29/02* | (2006.01) |
| *A47B 88/49* | (2017.01) |
| *A47B 88/48* | (2017.01) |

(52) U.S. Cl.
CPC ............ *F16C 29/004* (2013.01); *A47B 88/48* (2017.01); *A47B 88/49* (2017.01); *F16C 29/02* (2013.01)

(58) Field of Classification Search
CPC ..... A47B 88/407; A47B 88/43; A47B 88/483; A47B 88/487; A47B 88/49; A47B 88/493; F16C 29/004; F16C 29/02; F16C 29/04; F16C 29/045; F16C 29/046; F16C 2314/72

See application file for complete search history.

(56) References Cited

U.S. PATENT DOCUMENTS

| | | | | |
|---|---|---|---|---|
| 6,830,300 | B2 * | 12/2004 | Lauchner ............... | A47B 88/43 312/223.1 |
| 6,935,711 | B1 * | 8/2005 | Naue ...................... | A47B 88/43 312/223.1 |
| 6,957,878 | B2 * | 10/2005 | Greenwald ............ | A47B 88/43 312/223.1 |

(Continued)

FOREIGN PATENT DOCUMENTS

| | | |
|---|---|---|
| EP | 3 348 171 A1 | 7/2018 |
| TW | I593339 B | 7/2017 |

*Primary Examiner* — Phillip A Johnson
(74) *Attorney, Agent, or Firm* — Winston Hsu

(57) ABSTRACT

A slide rail mechanism includes a rail member, a supporting member, a first bracket and a fastening member. The rail member includes an upper wall, a lower wall and a longitudinal wall connected between the upper wall and the lower wall. The supporting member and the rail member are capable of moving relative to each other along a longitudinal direction. The supporting member includes an upper supporting portion, a lower supporting portion and a longitudinal portion connected between the upper supporting portion and the lower supporting portion. The first bracket and the supporting member are capable of moving relative to each other along the longitudinal direction. The fastening member is capable of in one of a first state and a second state relative to the first bracket.

20 Claims, 14 Drawing Sheets

(56) References Cited

U.S. PATENT DOCUMENTS

| | | | | |
|---|---|---|---|---|
| 8,727,138 | B2 * | 5/2014 | Dittus | H05K 7/1489 |
| | | | | 211/26 |
| 10,172,458 | B2 | 1/2019 | Chen | |
| 10,194,556 | B2 | 1/2019 | Chen | |
| 10,278,498 | B2 | 5/2019 | Chen | |
| 10,306,983 | B2 | 6/2019 | Chen | |
| 2011/0233355 | A1 | 9/2011 | Peng | |
| 2018/0116398 | A1 * | 5/2018 | Chen | H05K 7/1489 |
| 2018/0271275 | A1 * | 9/2018 | Chen | A47B 88/49 |

* cited by examiner

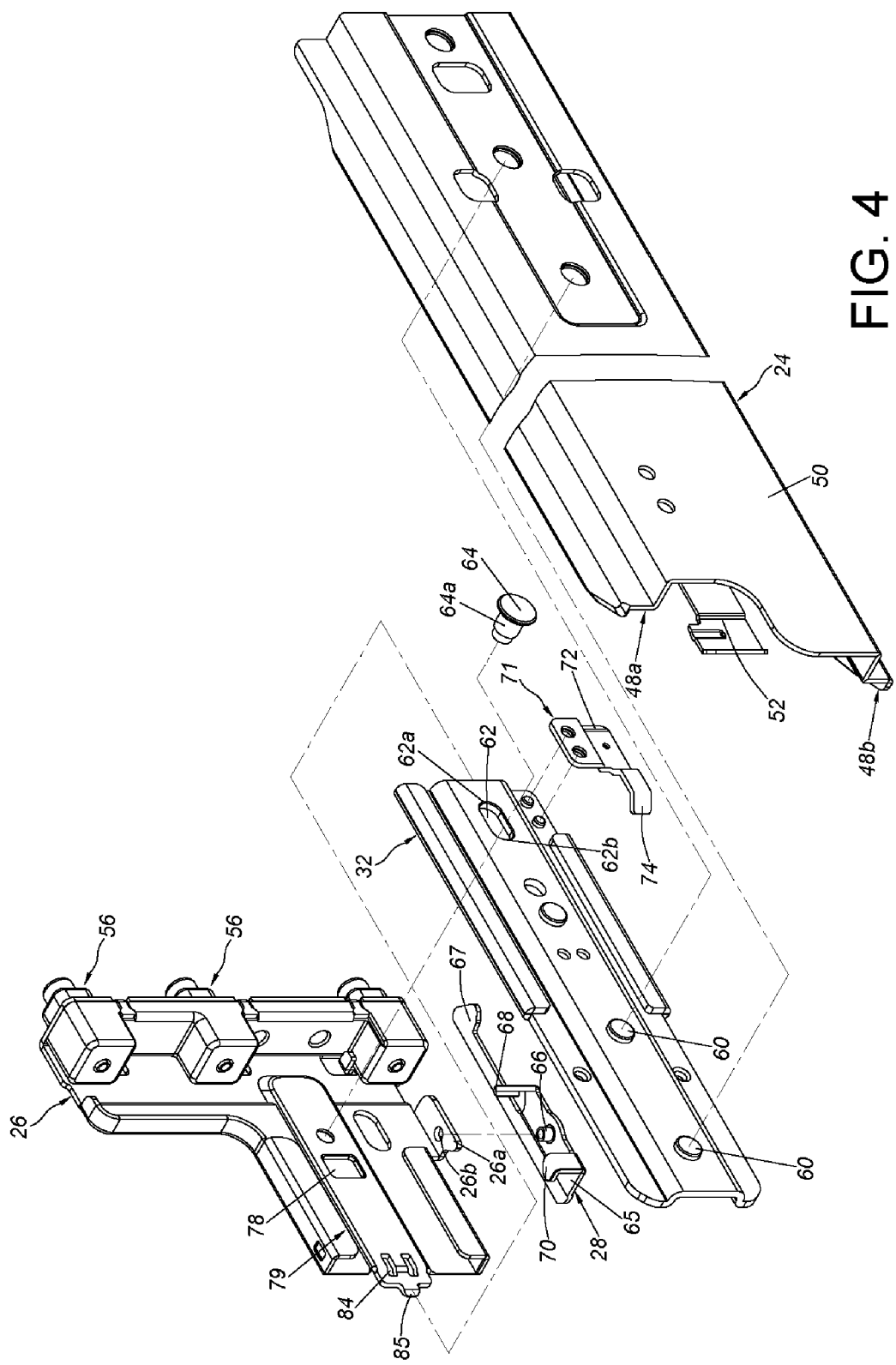

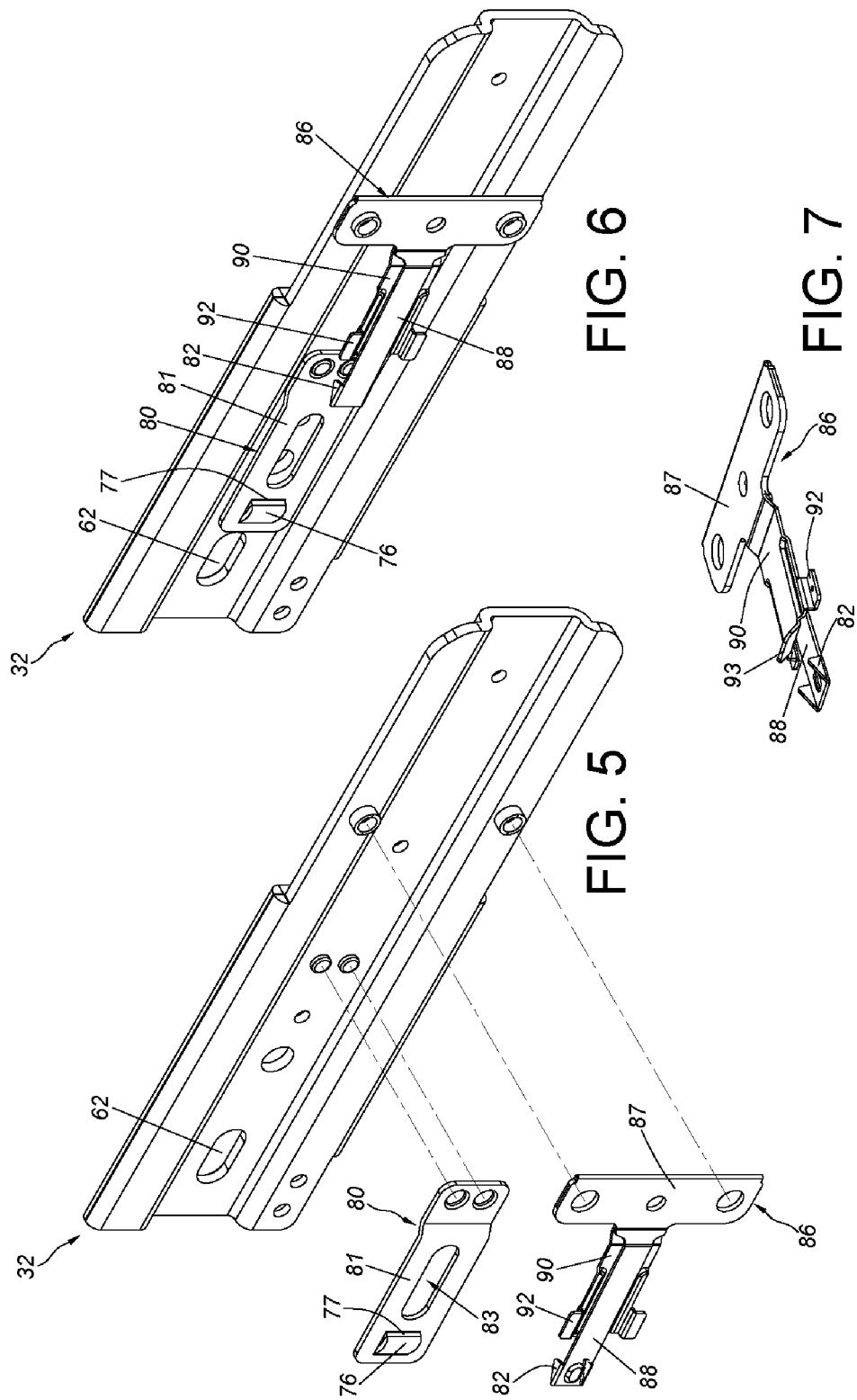

SLIDE RAIL MECHANISM

BACKGROUND OF THE INVENTION

1. Field of the Invention

The present invention relates to a slide rail mechanism, and more particularly, to a slide rail mechanism capable of improving support capability of a slide rail.

2. Description of the Prior Art

As shown in the US patent with U.S. Pat. No. 10,306,983 B2, a slide rail mechanism including a rail member, a first supporting frame, a second supporting frame and a bracket is disclosed. The rail member, the first supporting frame, the second supporting frame and the bracket together form a three-section telescopic bracket device. In the slide rail mechanism, the rail member (or a movable rail mounted on the rail member) is configured to support a weight of a carried object. In accordance with different needs, the weight of the carried object may be increased. In the situation, the support capability of the rail member is required to be increased.

Thus, development of a different slide rail product becomes an important issue.

SUMMARY OF THE INVENTION

According to one aspect of the present invention, a slide rail mechanism includes a rail member, a supporting member, a first bracket and a fastening member. The rail member includes an upper wall, a lower wall and a longitudinal wall connected between the upper wall and the lower wall. The supporting member and the rail member are capable of moving relative to each other along a longitudinal direction. The supporting member includes an upper supporting portion, a lower supporting portion and a longitudinal portion connected between the upper supporting portion and the lower supporting portion. The first bracket and the supporting member are capable of moving relative to each other along the longitudinal direction. The fastening member is capable of in one of a first state and a second state relative to the first bracket. The upper supporting portion of the supporting member wraps a portion of the upper wall of the rail member, and the lower supporting portion of the supporting member wraps a portion of the lower wall of the rail member. When the supporting member is moved from a first position to a second position relative to the first bracket, the supporting member is capable of driving the fastening member to change from the first state to the second state.

Preferably, the longitudinal wall of the rail member has a first side. The slide rail mechanism further includes a reinforcement member connected to the first side of the rail member.

Preferably, the longitudinal wall of the rail member further has a second side opposite to the first side. The slide rail mechanism further includes a movable rail arranged at the second side of the rail member.

Preferably, the slide rail mechanism further includes a second bracket mounted to one of the reinforcement member and the rail member.

Preferably, the reinforcement member includes an upper edge wall, a lower edge wall and an extension wall connected between the upper edge wall and the lower edge wall. The reinforcement member is connected to the first side of the rail member through the extension wall.

Preferably, the lower supporting portion of the supporting member has a first section and a second section. The first section is configured to support the lower wall of the rail member. The second section is bent relative to the first section. The second section is extended to adjacent to a side of the lower wall of the rail member.

Preferably, the upper supporting portion of the supporting member has a third section and a fourth section. The third section is configured to support the upper wall of the rail member. The fourth section is bent relative to the third section. The fourth section is extended to adjacent to a side of the upper wall of the rail member.

Preferably, the longitudinal portion and the lower supporting portion of the supporting member are connected through at least one first bend portion. The longitudinal portion and the upper supporting portion of the supporting member are connected through at least one second bend portion.

Preferably, the longitudinal portion, the at least one first bend portion and the at least one second bend portion of the supporting member together define a space. A position of the reinforcement member is corresponding to the space.

Preferably, one of the at least one first bend portion and the at least one second bend portion of the supporting member is configured to support the first side of the longitudinal wall of the rail member.

Preferably, one of the supporting member and the rail member is arranged with a first block feature, and the other one of the supporting member and the rail member is arranged with a second block feature. When the supporting member is moved from a first predetermined position to a second predetermined position relative to the rail member, the first block feature and the second block feature are capable of blocking each other.

Preferably, the slide rail mechanism further includes an auxiliary member connected to the supporting member. The first bracket is movably mounted to the auxiliary member.

Preferably, one of the auxiliary member and the first bracket is arranged with a limiting feature, and the other one of the auxiliary member and the first bracket is arranged with a connection member passing through a portion of the limiting feature.

Preferably, the auxiliary member is arranged with a first driving portion. When the supporting member is moved from the first position to the second position relative to the first bracket, the supporting member drives the fastening member to change from the first state to the second state through the first driving portion of the auxiliary member.

Preferably, the auxiliary member is further arranged with a second driving portion. When the supporting member is moved from the second position to the first position relative to the first bracket, the supporting member drives the fastening member to recover from the second state to the first state through the second driving portion of the auxiliary member.

Preferably, one of the supporting member and the first bracket is arranged with a first structure, the other one of the supporting member and the first bracket is arranged with a second structure. When the supporting member is located at the second position, the supporting member is capable of being kept at the second position through cooperation between the first structure and the second structure.

Preferably, one of the supporting member and the first bracket is arranged with a third structure, the other one of the supporting member and the first bracket is arranged with a fourth structure. When the supporting member is located at the second position, the supporting member is capable of being kept at the second position through cooperation between the third structure and the fourth structure.

According to another aspect of the present invention, the slide rail mechanism includes a rail member, a supporting member, a first bracket and a fastening member. The supporting member and the rail member are capable of moving relative to each other along a longitudinal direction. The first bracket and the supporting member are capable of moving relative to each other along the longitudinal direction. The fastening member is capable of in one of a first state and a second state relative to the first bracket. One of the supporting member and the first bracket is arranged with a first structure, and the other one of the supporting member and the first bracket is arranged with a second structure. When the supporting member is moved from a first position to a second position relative to the first bracket, the supporting member is capable of being kept at the second position through cooperation between the first structure and the second structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is an exploded diagram showing a supporting member and the first bracket of the slide rail mechanism according to the embodiment of the present invention.

FIG. 5 is an exploded diagram of an auxiliary member, a first locking member and a second locking member of the slide rail mechanism according to the embodiment of the present invention.

FIG. 6 is a combination diagram of the auxiliary member, the first locking member and the second locking member of the slide rail mechanism according to the embodiment of the present invention.

FIG. 7 is a three-dimensional diagram showing the second locking member of the slide rail mechanism according to the embodiment of the present invention.

DETAILED DESCRIPTION

In the following description, the phrase "longitudinal direction" refers to a direction parallel to an extending direction of a rail member. The phrase "transverse direction" refers a direction perpendicular to the extending direction of the rail member. When a component is "mounted on" or "connected to" another component, the components can be directly mounted on or directly connected to the another component, or there can be other components disposed between the two components. In contrary, when a component is "directly mounted on" or "directly connected to" another component, there are no other components disposed between the two components.

Figure 1:
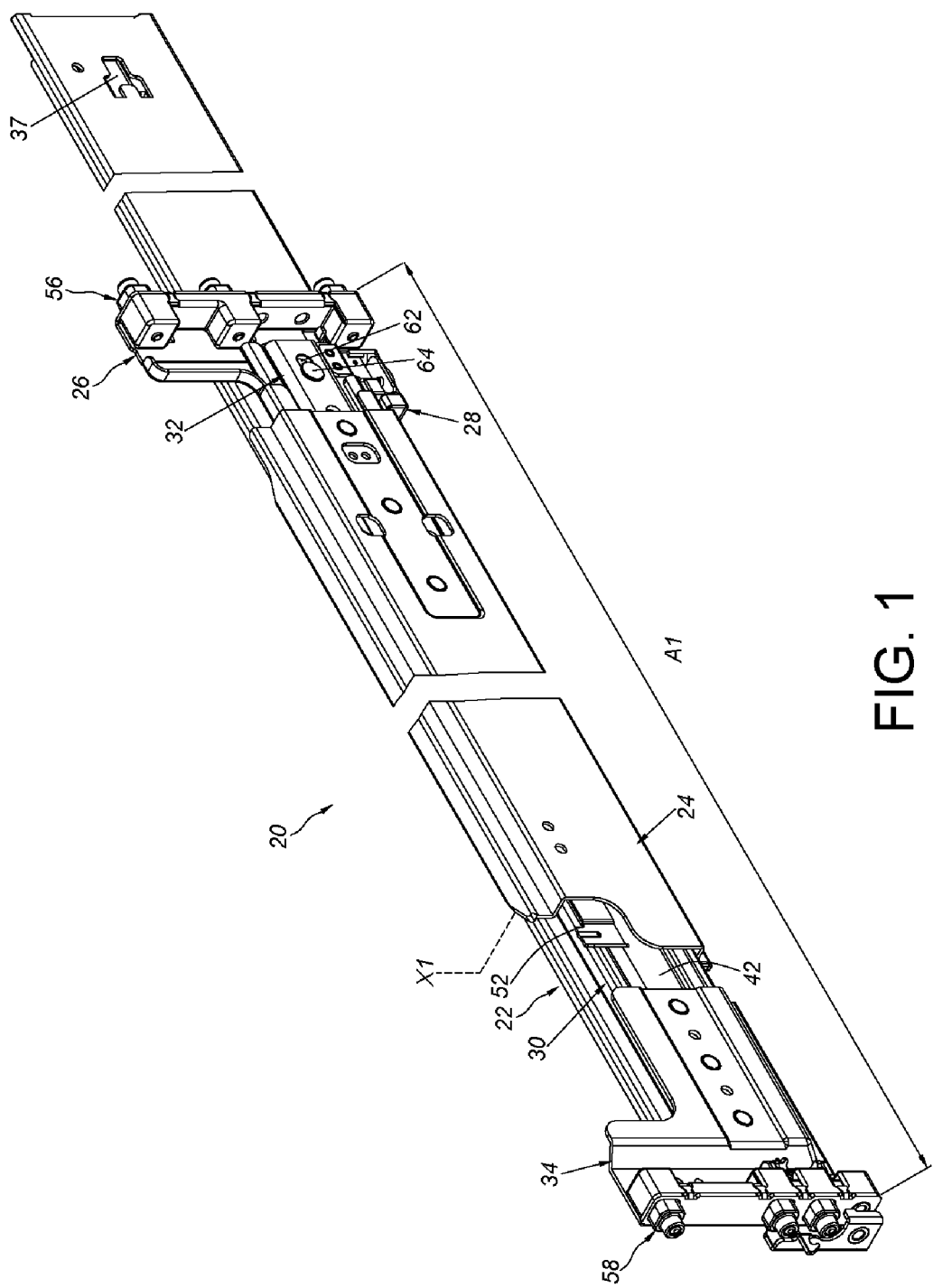
FIG. 1 is a three-dimensional diagram showing a slide rail mechanism including a first bracket and a second bracket together defining a first length according to an embodiment of the present invention.
Figure 2:
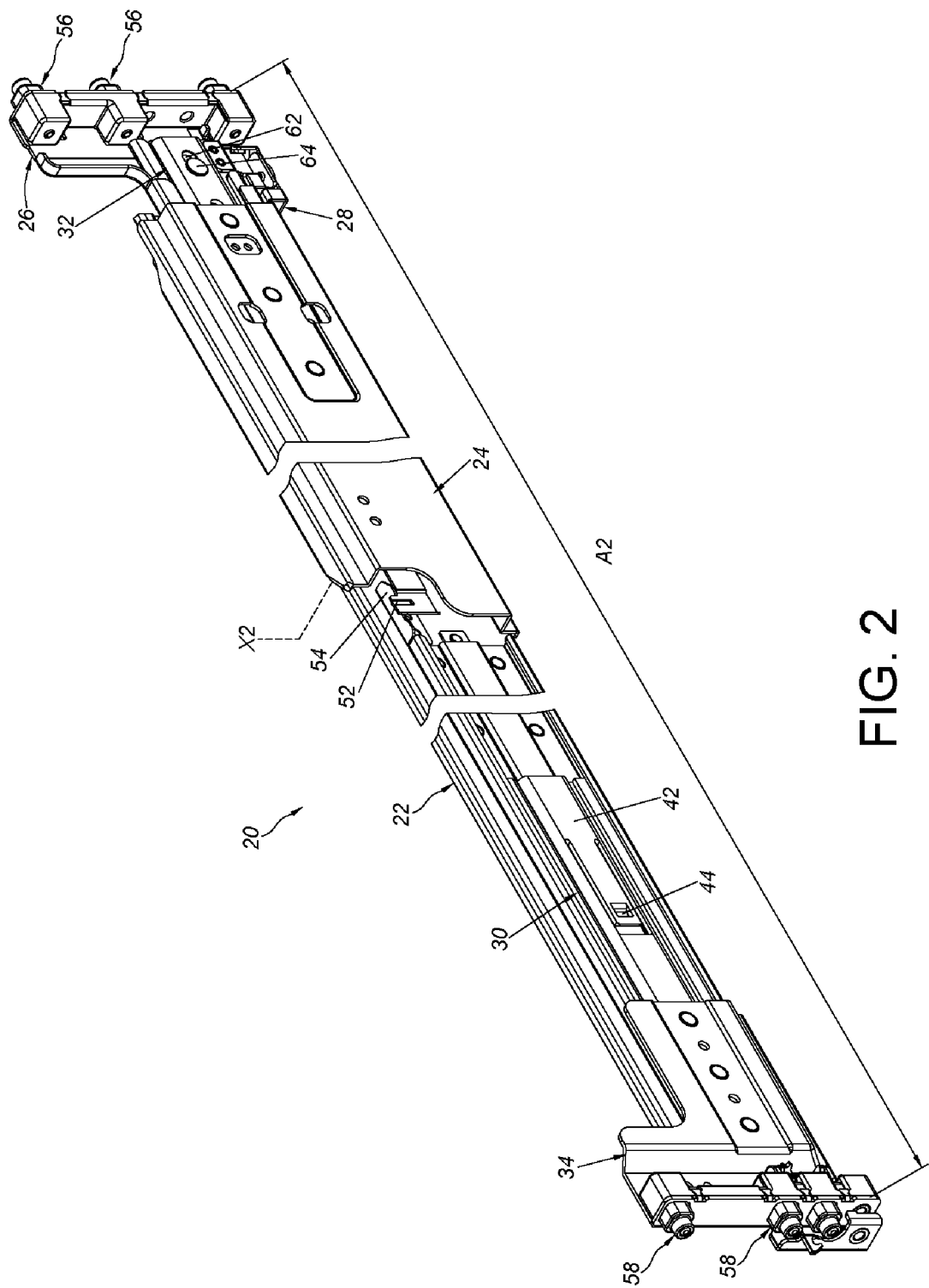
FIG. 2 is a three-dimensional diagram showing the slide rail mechanism including the first bracket and the second bracket together defining a second length according to the embodiment of the present invention.
Figure 3:
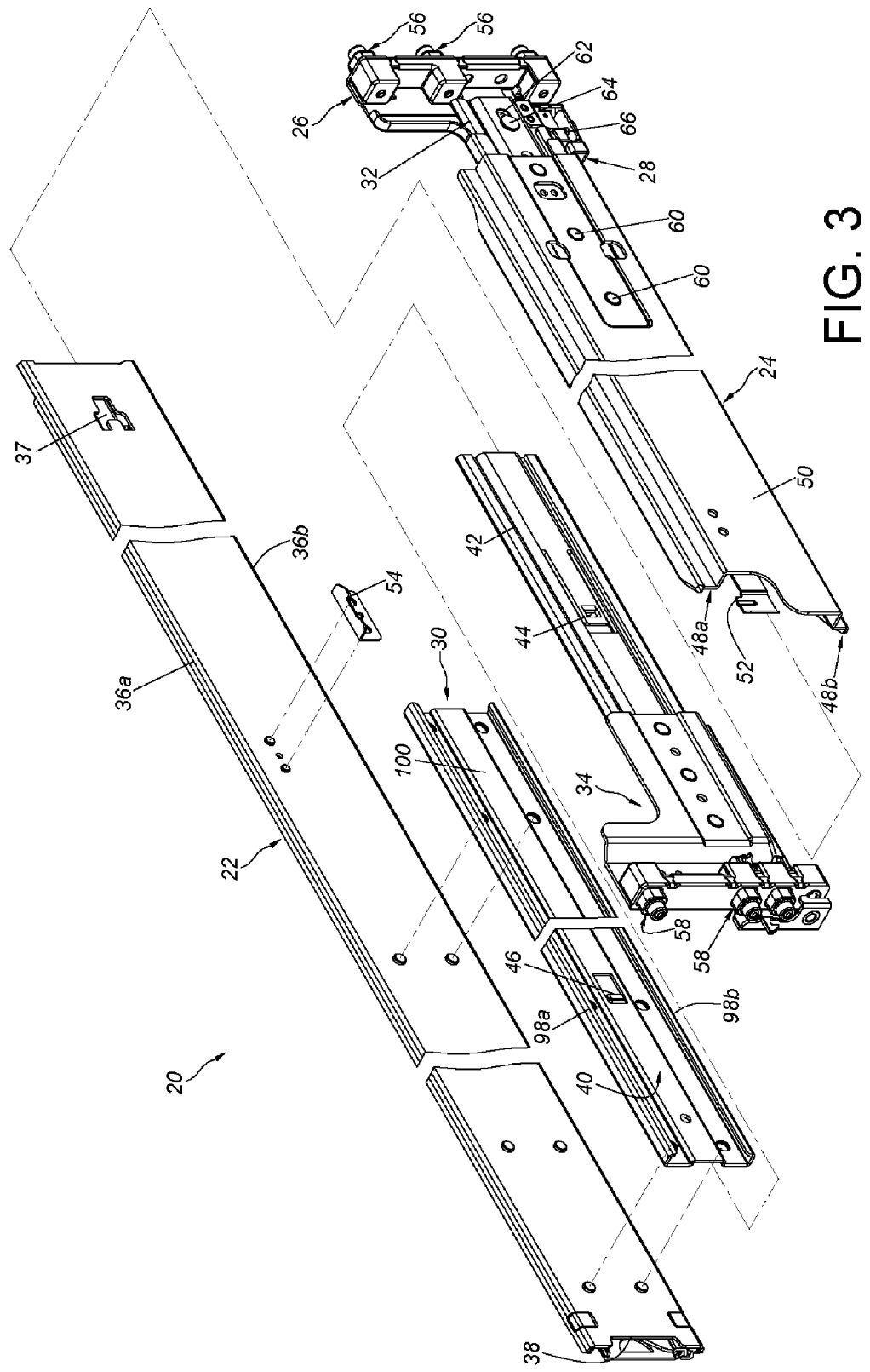
FIG. 3 is an exploded diagram showing the slide rail mechanism according to the embodiment of the present invention.

In FIG. 1, FIG. 2 and FIG. 3, the slide rail mechanism 20 according to the present invention includes a rail member 22, a supporting member 24, a first bracket 26 and a fastening member 28. Preferably, the slide rail mechanism 20 further includes a reinforcement member 30, an auxiliary member 32 and a second bracket 34.

The rail member 22 includes an upper wall 36a, a lower wall 36b and a longitudinal wall 38 connected between the upper wall 36a and the lower wall 36b. Preferably, the longitudinal wall 38 of the rail member 22 is arranged with a releasing space 37 adjacent to an end portion of the rail member 22. Herein, the releasing space 37 is a hole, which is only exemplary. In other embodiment, the releasing space 37 can be a groove, and the present invention is not limited thereto. Furthermore, the reinforcement member 30 is connected (such as fixedly connected) to the longitudinal wall 38 of the rail member 22, and thus can be regarded as a portion of the rail member 22. The reinforcement member 30 is arranged to away from the releasing space 37. The reinforcement member 30 includes a plurality of walls which define a reinforcement passage 40. The second bracket 34 is mounted to one of the reinforcement member 30 and the rail member 22. Herein, the second bracket 34 is mounted to the reinforcement member 30, which is only exemplary. Specifically, the second bracket 34 is movably mounted to the reinforcement passage 40 of the reinforcement member 30 through an extension member 42. Preferably, the extension member 42 and the reinforcement member 30 have a first block structure 44 and a second block structure 46, respectively. The first block structure 44 and the second block structure 46 are cooperated with each other.

Herein, both of the first block structure 44 and the second block structure 46 are protrusions, which is only exemplary, and the present invention is not limited thereto. With the arrangement, when the second bracket 34 is located at a position relative to the reinforcement member 30, the first block structure 44 and the second block structure 46 are capable of blocking each other. Specifically, the first block structure 44 is protruded towards the reinforcement member 30, and the second block structure 46 is protruded towards the extension member 42.

The supporting member 24 and the rail member 22 are capable of moving relative to each other along a longitudinal direction. The supporting member 24 includes an upper supporting portion 48a, a lower supporting portion 48b and a longitudinal portion 50 connected between the upper supporting portion 48a and the lower supporting portion 48b. Preferably, the auxiliary member 32 is connected to the supporting member 24. Herein, the auxiliary member 32 is fixedly connected to the supporting member 24, and thus can be regarded as a portion of the supporting member 24. In other embodiment, the auxiliary member 32 can be integrally formed on the supporting member 24.

The first bracket 26 and the supporting member 24 are capable of moving relative to each other along the longitudinal direction. Herein, the first bracket 26 is movably mounted to the auxiliary member 32, but the present invention is not limited thereto. Further, the fastening member 28 is movable relative to the first bracket 26.

Preferably, the supporting member 24 is arranged with a first block feature 52, and the rail member 22 is arranged with a second block feature 54. Herein, the first block feature 52 and the second block feature 54 are extra components connected to the supporting member 24 and the rail member 22, respectively. In other embodiment, the first block feature 52 can be integrally formed on the supporting member 24, and the second block feature 54 can be integrally formed on the rail member 22, and the present invention is not limited thereto. When the supporting member 24 is moved from a first predetermined position X1 (shown in FIG. 1) to a second predetermined position X2 (shown in FIG. 2) relative to the rail member 22, the first block feature 52 and the second block feature 54 are capable of blocking each other. When the supporting member 24 is located at the first predetermined position X1, a first length A1 is defined between the first bracket 26 and the second bracket 34. When the supporting member 24 is located at the second predetermined position X2, the second block feature 54 blocks the first block feature 52, and a second length A2 is defined between the first bracket 26 and the second bracket 34. The second length A2 is longer than the first length A1.

As shown in FIG. 3 and FIG. 4, the auxiliary member 32 is fixedly connected to the supporting member 24 through a fixing part 60. Moreover, the auxiliary member 32 is arranged with a limiting feature 62 (such as a longitudinal hole or groove with a boundary, but the invention is not limited thereto). The first bracket 26 is arranged with a connection member 64 passing through a portion of the limiting feature 62, such that the first bracket 26 and the auxiliary member 32 are movable relative to each other. Specifically, the connection member 64 has an inserting portion 64a, and the inserting portion 64a is inserted in the limiting feature 62, a longitudinal length of the inserting portion 64a is less than a longitudinal length of the limiting feature 62, such that the inserting portion 64a is movable in the limiting feature 62 along the longitudinal direction, which enables the first bracket 26 to be movable relative to the auxiliary member 32/the supporting member 24 along the longitudinal direction. More specifically, the limiting feature 62 has a first end 62a and a second end 62b, and the inserting portion 64a is switchable between the first end 62a and the second end 62b. That is, the inserting portion 64a of the connection member 64 is capable of moving longitudinally along the limiting feature 62 between the first end 62a and the second end 62b.

Preferably, the fastening member 28 is pivotally connected to the first bracket 26 through a shaft member 66. Specifically, the fastening member 28 includes a main body 65 and a fastening portion 67 connected to the main body 65. The main body 65 includes a first contact portion 68 and a second contact portion 70. The shaft member 66 is substantially located between the first contact portion 68 and the second contact portion 70.

More specifically, the first bracket 26 includes an extension portion 26a. The extension portion 26a is extended from a bottom of the first bracket 26 along a transverse direction. The extension portion 26a is formed with a pivot hole 26b. The shaft member 66 is passed through the pivot hole 26b and is pivotally connected to the first bracket 26. The fastening member 28 is disposed at the bottom of the first bracket 26. The first contact portion 68 and the second contact portion 70 of the fastening member 28 are located at a side of the first bracket 26, which is the same as the side where the extension portion 26a of the first bracket 26 located. The fastening portion 67 of the fastening member 28 is located at another side of the first bracket 26, which is different from the side where the extension portion 26a of the first bracket 26 located.

Moreover, the auxiliary member 32 is arranged with a first driving portion 72 and a second driving portion 74. The first driving portion 72 and the second driving portion 74 can be integrally formed on an accessory 71. The accessory 71 can be fixedly connected to the auxiliary member 32, and thus can be regarded as a portion of the auxiliary member 32. Alternatively, in other embodiment, the first driving portion 72 and the second driving portion 74 can be integrally formed on the auxiliary member 32, and the present invention is not limited thereto.

Preferably, the first driving portion 72 and the second driving portion 74 can be arranged at a side of the auxiliary member 32 (shown in FIG. 4). Herein, the first driving portion 72 and the second driving portion 74 are arranged at a bottom of the auxiliary member 32. The first driving portion 72 and the second driving portion 74 are arranged at the side of the auxiliary member 32 away from the first bracket 26. The first driving portion 72 and the second driving portion 74 are extended towards the first bracket 26. The first driving portion 72 is corresponding to the first contact portion 68. The second driving portion 74 is corresponding to the second contact portion 70.

Moreover, a first structure 76 is arranged at another side of the auxiliary member 32 (shown in FIG. 5 and FIG. 6), and the first bracket 26 is arranged with a second structure 78 (shown in FIG. 4). The second structure 78 is configured to cooperate with the first structure 76. One of the first structure 76 and the second structure 78 can be a convex structure, and the other one of the first structure 76 and the second structure 78 can be a concave structure (such as a hole or a groove). Herein, the first structure 76 is a convex structure, and is arranged at a side of the auxiliary member 32 facing towards the first bracket 26. The second structure 78 is a concave structure, and the first structure 76 is capable of engaging with the second structure 78. In other embodiment, the first structure 76 can be a concave structure, the second structure 78 can be a convex structure, and the second structure 78 can be arranged at a side of the first bracket 26 facing towards the auxiliary member 32. The second structure 78 is capable of engaging with the first structure 76. Herein, the first structure 76 is arranged at a first locking member 80, and the first locking member 80 is fixed to the auxiliary member 32 (or the supporting member 24)), which is only exemplary. Alternatively, in other embodiment, the first structure 76 can be directly integrally formed on the auxiliary member 32, and the present invention is not limited thereto. Herein, the second structure 78 is arranged on a corresponding structure 79. The corresponding structure 79 is a convex structure formed on the first bracket 26, and the convex structure (i.e., the corresponding structure 79) is formed by stamping and is integrally formed on the first bracket 26.

Preferably, the first structure 76 includes at least one guiding portion 77, and the guiding portion 77 includes an inclined surface or a curved surface.

Preferably, the first locking member 80 includes a first elastic section 81, and the first structure 76 is arranged at the first elastic section 81. Herein, the first elastic section 81 is formed with an elongated hole 83 for adjusting (such as increasing) the elasticity of the first elastic section 81.

Preferably, the auxiliary member 32 is arranged with a third structure 82 (shown in FIG. 5 and FIG. 6), and the first bracket 26 is arranged with a fourth structure 84 (shown in FIG. 4). The fourth structure 84 is configured to cooperate with the third structure 82. One of the third structure 82 and the fourth structure 84 can be a convex structure, and the other one of the third structure 82 and the fourth structure 84 can be a concave structure (such as a hole or a groove). Herein, the third structure 82 is arranged at a second locking member 86, and the second locking member 86 is fixed to the auxiliary member 32 (or the supporting member 24). Herein, the fourth structure 84 is arranged on the corresponding structure 79. The third structure 82 is a protruding structure, the fourth structure 84 is a slot structure, and the third structure 82 is capable of engaging with the fourth structure 84. In other embodiment, the third structure 82 can be a slot structure, the fourth structure 84 can be a protruding structure, and the fourth structure 84 is capable of engaging with the third structure 82.

Preferably, the first bracket 26 is further arranged with a supporting feature 85 adjacent to the fourth structure 84, and the supporting feature 85 includes an inclined surface or a curved surface. Herein, the supporting feature 85 is arranged on the corresponding structure 79, which is only exemplary.

Preferably, the second locking member 86 includes a second elastic section 88. The third structure 82 is arranged at the second elastic section 88. The number of third structures 82 is two and the two third structures 82 are disposed on two opposite sides of the second elastic section 88 and are extended from the second elastic section 88 along the transverse direction. Herein, the third structures 82 are formed by stamping and are bent relative to the second elastic section 88, which is only exemplary and the present invention is not limited thereto.

Preferably, the second locking member 86 further includes a third elastic section 90 adjacent to the second elastic section 88. The second elastic section 88 and the third elastic section 90 are extended from a fixing section 87 of the second locking member 86. The fixing section 87 is configured to be fixed on the auxiliary member 32 (such as by riveting). The third elastic section 90 and the second elastic section 88 are capable of moving toward each other or moving away from each other. The third elastic section 90 is arranged with a releasing feature 92 and a corresponding feature 93 (shown in FIG. 7). The releasing feature 92 is located at a side of the second elastic section 88. For example, the releasing feature 92 can be an extension leg or an extension arm, and the present invention is not limited thereto. The corresponding feature 93 includes an inclined surface or a curved surface. The corresponding feature 93 is configured to cooperate with the supporting feature 85 of the first bracket 26. Herein, the releasing feature 92 is extended relative to the third elastic section 90 along the transverse direction. The releasing feature 92 is bent relative to the third elastic section 90. The corresponding feature 93 is extended from the third elastic section 90 along the transverse direction and is bent relative to the third elastic section 90.

Figure 8:
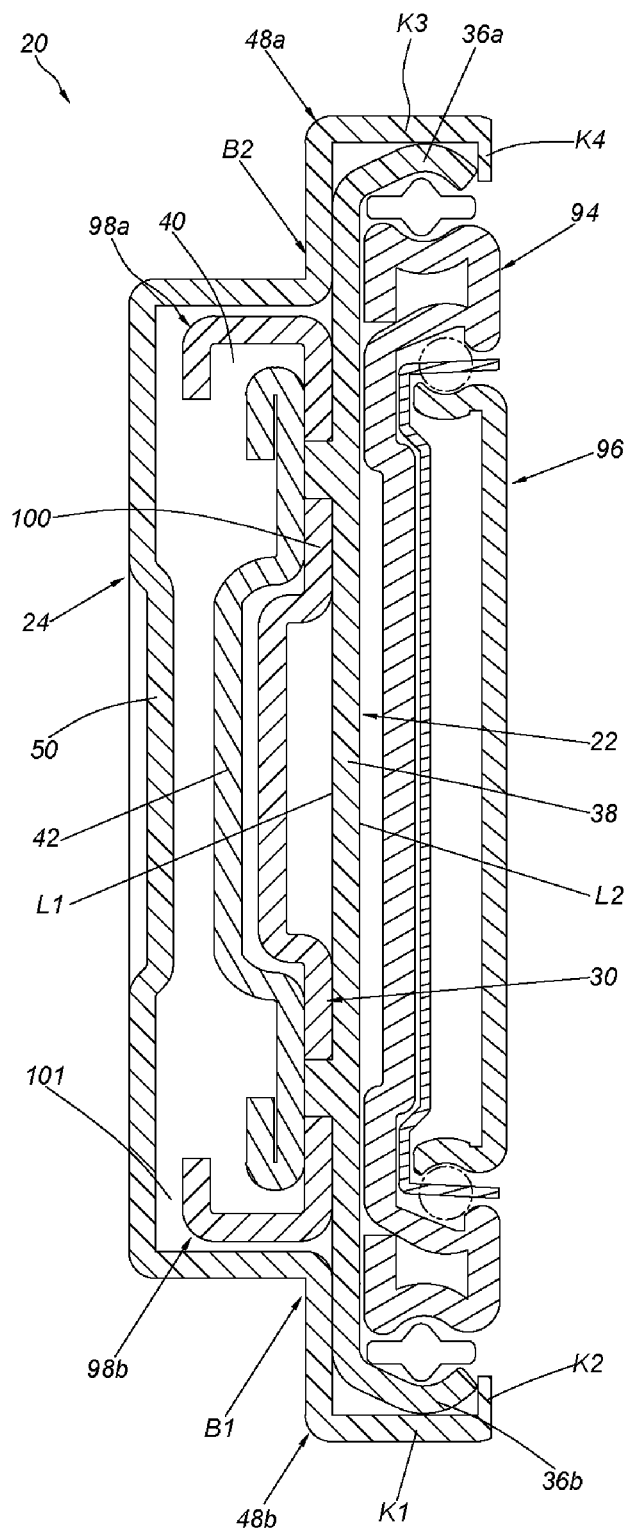
FIG. 8 is a cross-sectional view of the slide rail mechanism according to the embodiment of the present invention.

As shown in FIG. 8, the longitudinal wall 38 of the rail member 22 has a first side L1 and a second side L2 opposite to the first side L1. The reinforcement member 30 is connected to the first side L1 of the rail member 22. Preferably, the slide rail mechanism 20 can further include a first movable rail 94 and a second movable rail 96 arranged at the second side L2 of the rail member 22. The rail member 22, the first movable rail 94 and the second movable rail 96 are telescopically connected with each other and form a three-section slide rail.

Preferably, the reinforcement member 30 includes an upper edge wall 98a, a lower edge wall 98b and an extension wall 100 connected between the upper edge wall 98a and the lower edge wall 98b. The reinforcement member 30 is connected to the first side L1 of the rail member 22 through the extension wall 100. The upper edge wall 98a, the lower edge wall 98b and the extension wall 100 together define the reinforcement passage 40.

The lower supporting portion 48b of the supporting member 24 wraps a portion of the lower wall 36b of the rail member 22. Preferably, the lower supporting portion 48b of the supporting member 24 has a first section K1 and a second section K2. The first section K1 is configured to support the lower wall 36b of the rail member 22. The second section K2 is bent relative to the first section K1, and the second section K2 is extended to adjacent to a side of the lower wall 36b of the rail member 22.

The upper supporting portion 48a of the supporting member 24 wraps a portion of the upper wall 36a of the rail member 22. Preferably, the upper supporting portion 48a of the supporting member 24 has a third section K3 and a fourth section K4. The third section K3 is configured to support the upper wall 36a of the rail member 22. The fourth section K4 is bent relative to the third section K3, and the fourth section K4 is extended to adjacent to a side of the upper wall 36a of the rail member 22.

Preferably, the longitudinal portion 50 and the lower supporting portion 48b of the supporting member 24 are connected through at least one first bend portion B1, and the longitudinal portion 50 and the upper supporting portion 48a of the supporting member 24 are connected through at least one second bend portion B2.

Preferably, the longitudinal portion 50, the at least one first bend portion B1 and the at least one second bend portion B2 of the supporting member 24 together define a space 101, and a position of the reinforcement member 30 is corresponding to the space 101.

Preferably, one of the at least one first bend portion B1 and the at least one second bend portion B2 of the supporting member 24 is configured to support the first side L1 of the longitudinal wall 38 of the rail member 22. Herein, the at least one first bend portion B1 and the at least one second bend portion B2 of the supporting member 24 together support the first side L1 of the longitudinal wall 38 of the rail member 22.

Figure 9:
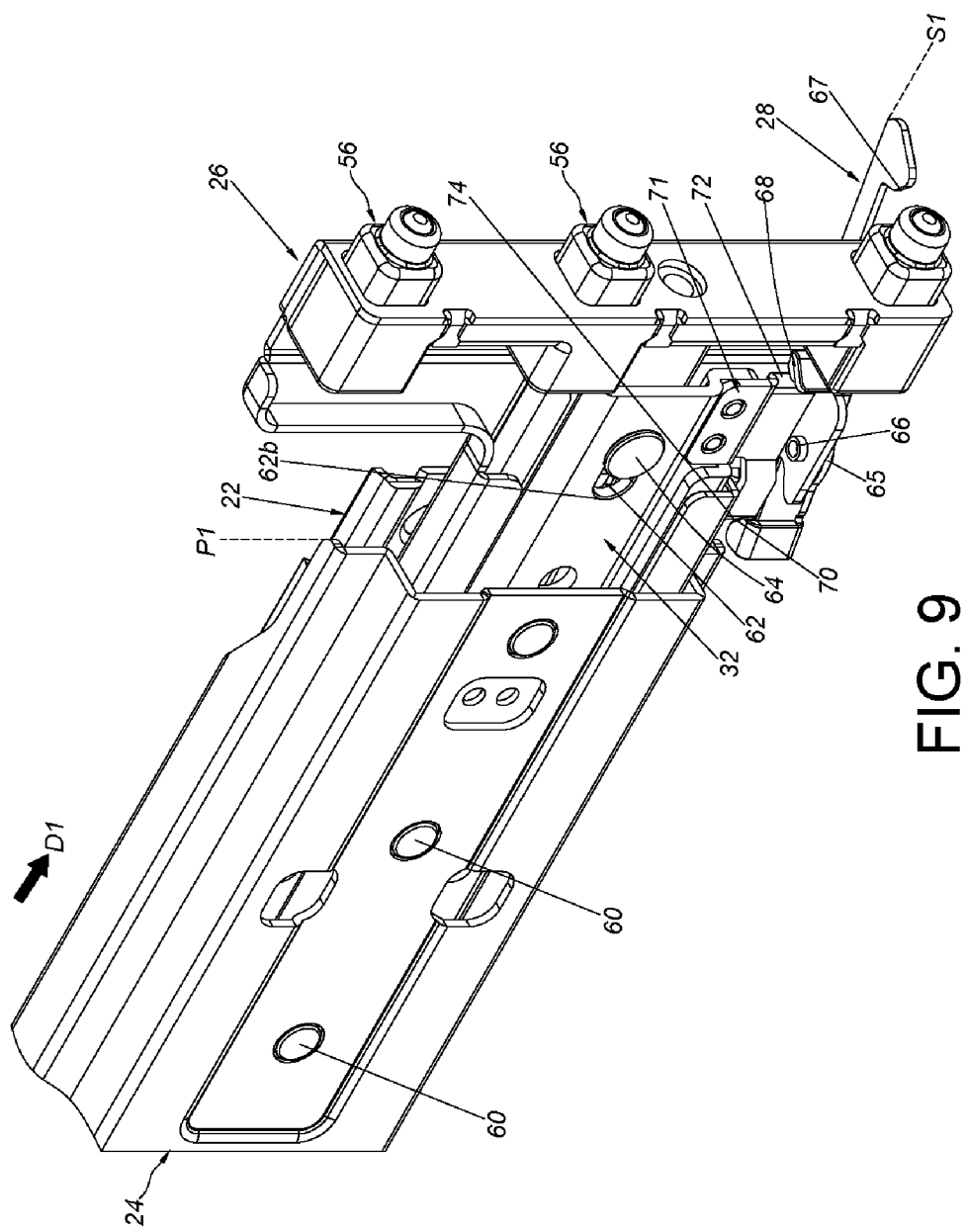
FIG. 9 is a schematic diagram showing the supporting member of the slide rail mechanism located at a first position relative to the first bracket according to the embodiment of the present invention.
Figure 10:
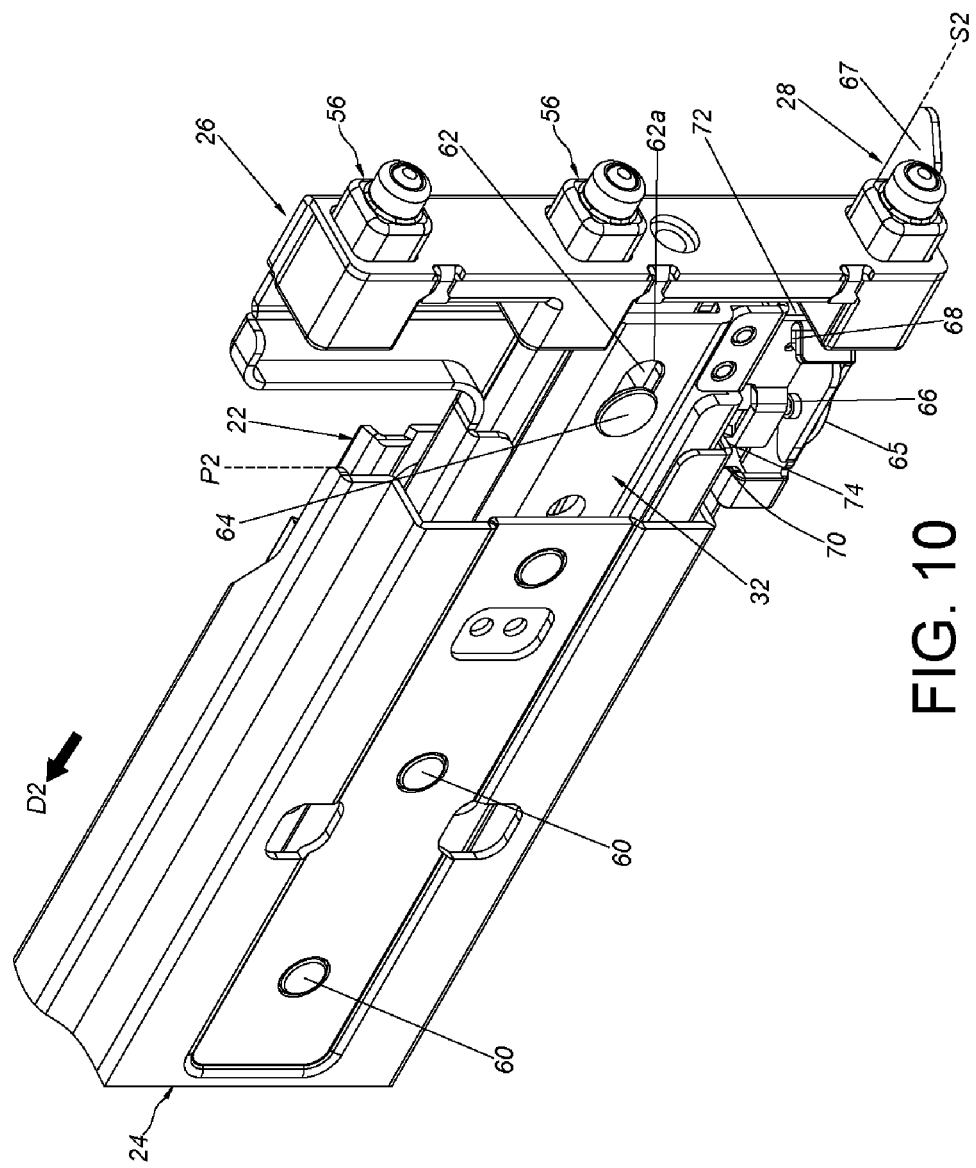
FIG. 10 is a schematic diagram showing the supporting member of the slide rail mechanism located at a second position relative to the first bracket according to the embodiment of the present invention.

As shown in FIG. 9 and FIG. 10, the fastening member 28 is capable of in one of a first state S1 (such as an unlocking state) and a second state S2 (such as a locking state) relative to the first bracket 26. When the fastening member 28 is located at the first state S1 (shown in FIG. 9), the fastening portion 67 of the fastening member 28 is away from at least one first mounting member 56 of the first bracket 26. When the fastening member 28 is located at the second state S2 (shown in FIG. 10), the fastening portion 67 of the fastening member 28 is adjacent to the at least one first mounting member 56 of the first bracket 26. Specifically, the fastening member 28 can be pivoted relative to the first bracket 26 by the shaft member 66 to switch between the first state S1 and the second state S2.

Figure 16:
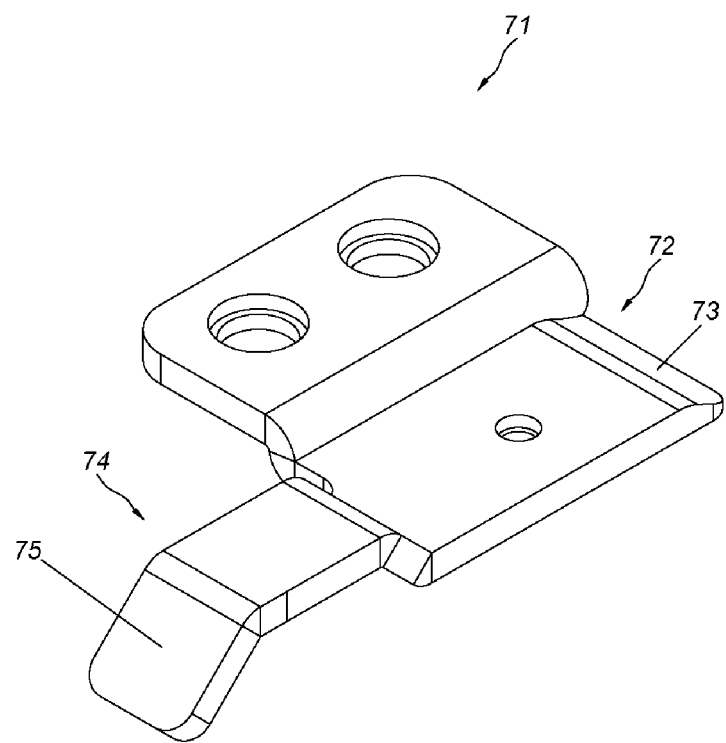
FIG. 16 is a three-dimensional diagram showing an accessory according to the embodiment of the present invention.

Preferably, one of the first contact portion 68 of the fastening member 28 and the first driving portion 72 of the auxiliary member 32 includes a first guiding feature 73 (such as an inclined surface or a curved surface). Furthermore, one of the second contact portion 70 of the fastening member 28 and the second driving portion 74 of the auxiliary member 32 includes a second guiding feature 75 (such as an inclined surface or a curved surface). Herein, as shown in FIG. 16, the first driving portion 72 includes the first guiding feature 73, and the second driving portion 74 includes the second guiding feature 75, which are only exemplary.

When the supporting member 24 is moved from a first position P1 (shown in FIG. 9) to a second position P2 (shown in FIG. 10) relative to the first bracket 26 along a first direction D1, the supporting member 24 contacts the first contact portion 68 of the fastening member 28 through the first driving portion 72 of the auxiliary member 32, such that the supporting member 24 drives the fastening member 28 to change from the first state S1 (shown in FIG. 9) to the second state S2 (shown in FIG. 10). That is, the supporting member 24 drives the fastening member 28 to change from the first state S1 to the second state S2 through the first driving portion 72 of the auxiliary member 32. Specifically, when the supporting member 24 is moved from the first position P1 (shown in FIG. 9) to the second position P2 (shown in FIG. 10) relative to the first bracket 26 along the first direction D1, the auxiliary member 32 is driven by the supporting member 24 to move along the first direction D1, such that the second end 62b of the limiting feature 62 is moved towards the connection member 64, and the first end 62a of the limiting feature 62 is moved away from the connection member 64. The first driving portion 72 of the auxiliary member 32 contacts and pushes the first contact portion 68 of the fastening member 28, such that the fastening member 28 is pivoted to change from the first state S1 (shown in FIG. 9) to the second state S2 (shown in FIG. 10). In other words, when the supporting member 24 is located at the first position P1 relative to the first bracket 26, the connection member 64 is located at the first end 62a of the limiting feature 62; when the supporting member 24 is located at the second position P2 relative to the first bracket 26, the connection member 64 is located at the second end 62b of the limiting feature 62.

In contrary, when the supporting member 24 is moved from the second position P2 (shown in FIG. 10) to the first position P1 relative to the first bracket 26 along a second direction D2 opposite to the first direction D1, the supporting member 24 contacts the second contact portion 70 of the fastening member 28 through the second driving portion 74 of the auxiliary member 32, such that the supporting member 24 drives the fastening member 28 to recover from the second state S2 (shown in FIG. 10) to the first state S1 (shown in FIG. 9). That is, the supporting member 24 drives the fastening member 28 to recover from the second state S2 to the first state S1 through the second driving portion 74 of the auxiliary member 32. Specifically, when the supporting member 24 is moved from the second position P2 to the first position P1 relative to the first bracket 26 along the second direction D2 opposite to the first direction D1, the auxiliary member 32 is driven by the supporting member 24 to move along the second direction D2, such that the first end 62a of the limiting feature 62 is moved towards the connection member 64, and the second end 62b of the limiting feature 62 is moved away from the connection member 64. The second driving portion 74 of the auxiliary member 32 contacts and pushes the second contact portion 70 of the fastening member 28, such that the fastening member 28 is pivoted to change from the second state S2 (shown in FIG. 10) to the first state S1 (shown in FIG. 9).

Figure 11:
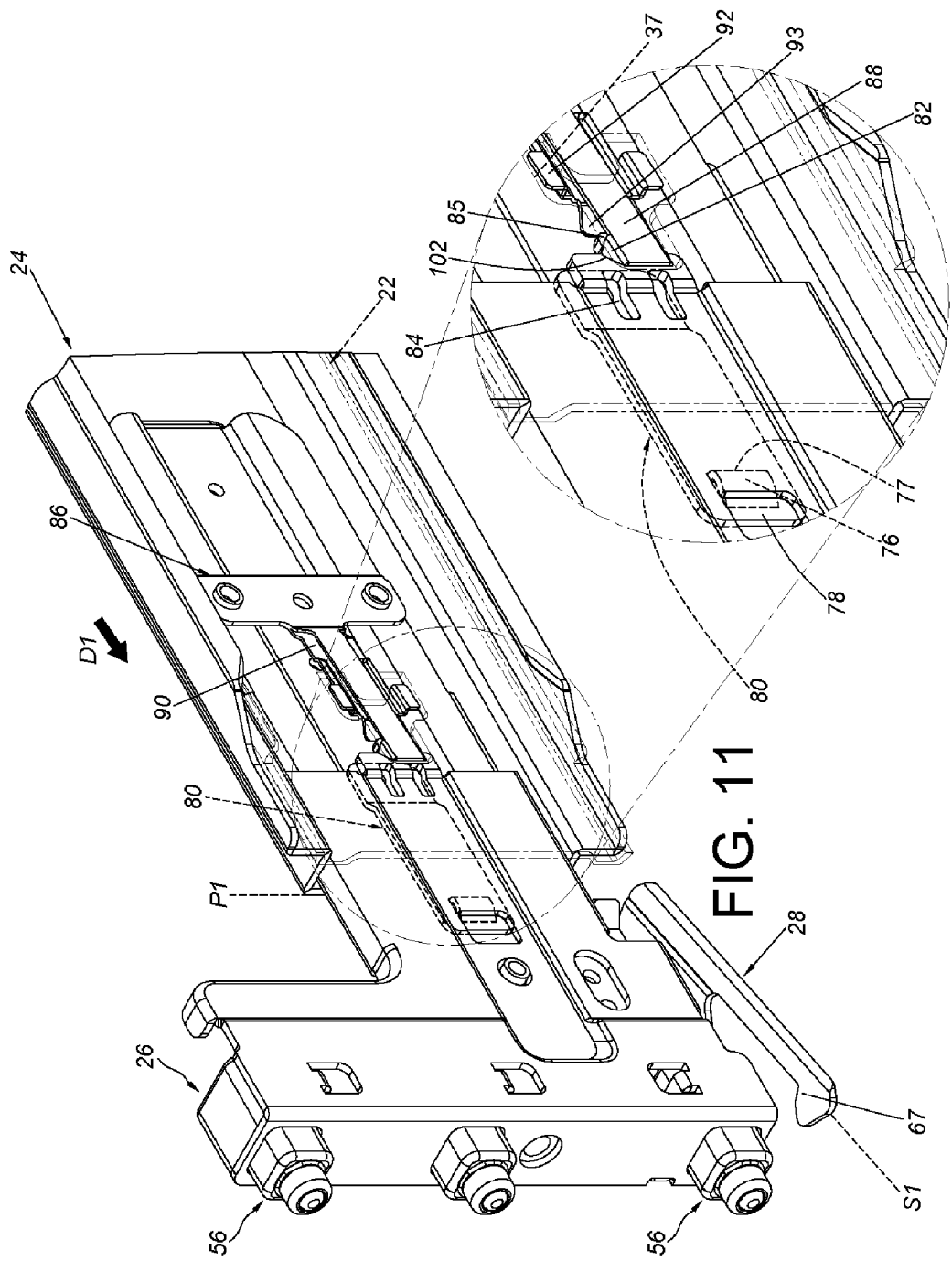
FIG. 11 is a schematic diagram showing the supporting member of the slide rail mechanism located at the first position relative to the first bracket in another view angle according to the embodiment of the present invention.

As shown in FIG. 11, when the supporting member 24 is located at the first position P1 relative to the first bracket 26, there is a predetermined distance between the first structure 76 of the first locking member 80 and the second structure 78 of the first bracket 26. Preferably, the third elastic section 90 and the second elastic section 88 are close to each other. There is a predetermined distance between the third structure 82 of the second elastic section 88 and the fourth structure 84 of the first bracket 26. Preferably, the third structure 82 of the second elastic section 88 has a guiding surface 102. For example, the guiding surface 102 is an inclined surface or a curved surface. Preferably, the releasing feature 92 of the third elastic section 90 is corresponding to the releasing space 37 of the rail member 22, and there is a predetermined distance between the corresponding feature 93 of the third elastic section 90 and the supporting feature 85 of the first bracket 26.

Figure 12:
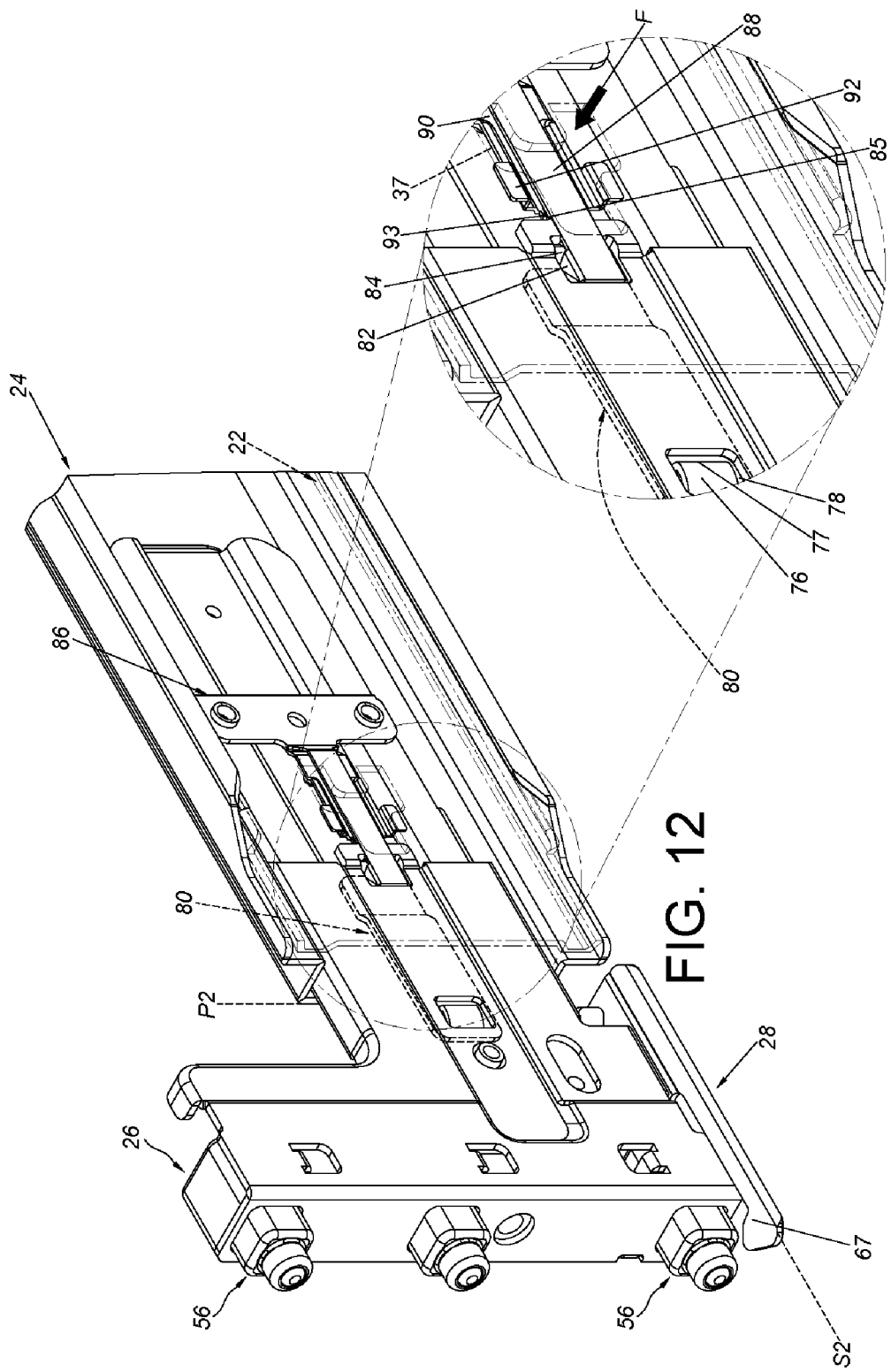
FIG. 12 is a schematic diagram showing the supporting member of the slide rail mechanism located at the second position relative to the first bracket in another view angle according to the embodiment of the present invention.

As shown in FIG. 11 and FIG. 12, the supporting member 24 is capable of moving from the first position P1 (shown in FIG. 11) to the second position P2 (shown in FIG. 12) relative to the first bracket 26 along the first direction D1.

The supporting member 24 is capable of being kept at the second position P2 through cooperation between the first structure 76 and the second structure 78. For example, the first structure 76 of the first locking member 80 is capable of engaging with the second structure 78 of the first bracket 26, such that a first lock mechanism can be provided when the supporting member 24 is located at the second position P2 relative to the first bracket 26.

Preferably, the supporting member 24 is capable of being kept at the second position P2 through cooperation between the third structure 82 and the fourth structure 84. For example, during the process that the supporting member 24 moves from the first position P1 to the second position P2 along the first direction D1, the corresponding feature 93 of the third elastic section 90 contacts the supporting feature 85 of the first bracket 26 to generate a force F (shown in FIG. 12), such that the third elastic section 90 swings an angle in response to the force F, and the releasing feature 92 of the third elastic section 90 no longer corresponds to the releasing space 37 of the rail member 22 and is supported by the longitudinal wall 38 of the rail member 22. At this moment, the third elastic section 90 can accumulate an elastic force. The third elastic section 90 no longer closes to the second elastic section 88, and the third structure 82 of the second elastic section 88 is capable of engaging with the fourth structure 84 of the first bracket 26, such that a second lock mechanism can be provided when the supporting member 24 is located at the second position P2 relative to the first bracket 26.

Furthermore, when the first structure 76 of the first locking member 80 is disengaged from the second structure 78 of the first bracket 26, and the third structure 82 of the second locking member 86 is disengaged from the fourth structure 84 of the first bracket 26, the supporting member 24 is capable of returning to the first position P1 (shown in FIG. 11) from the second position P2 (shown in FIG. 12) relative to the first bracket 26. For example, as shown in FIG. 12, with the rail member 22 being capable of moving relative to the supporting member 24 located at the second position P2 along the first direction D1, the releasing feature 92 of the third elastic section 90 is enable to correspond to the releasing space 37 of the rail member 22 again, and the third elastic section 90 releases the elastic force to close to the second elastic section 88 again, such that the third structure 82 of the second elastic section 88 is disengaged from the fourth structure 84 of the first bracket 26. Furthermore, with the guiding portion 77 of the first structure 76, the first structure 76 of the first elastic section 81 of the first locking member 80 is capable of disengaging from the second structure 78 of the first bracket 26 during the process that the supporting member 24 returning to the first position P1 from the second position P2 relative to the first bracket 26. Alternatively, in other operation mode, the engagement between the first structure 76 and the second structure 78 and the engagement between the third structure 82 and the fourth structure 84 can be disengaged manually.

Figure 13:
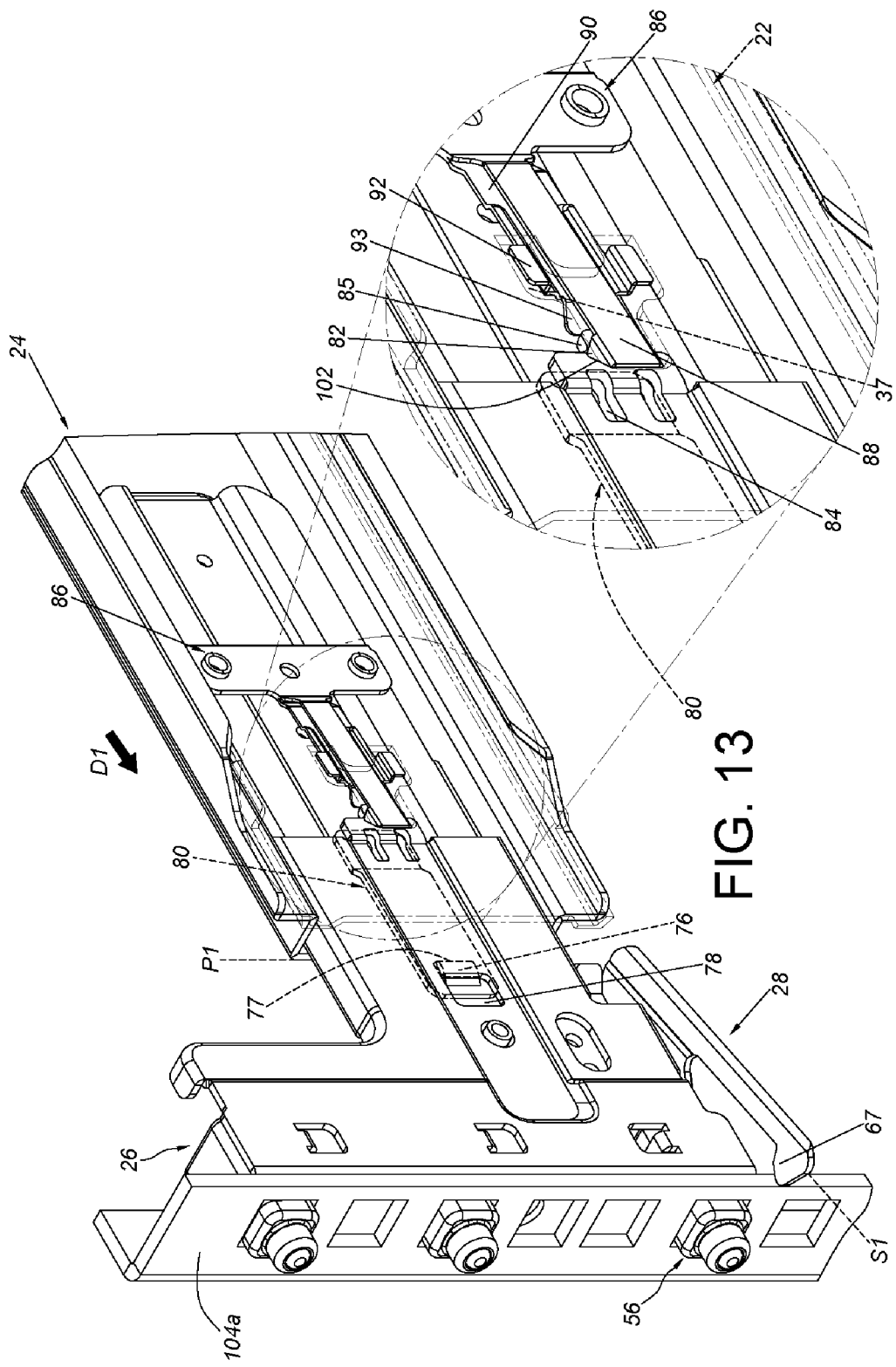
FIG. 13 is a schematic diagram showing the supporting member of the slide rail mechanism located at the first position relative to the first bracket in which the fastening member of the first bracket has not yet fastened to a first post of a rack according to the embodiment of the present invention.
Figure 14:
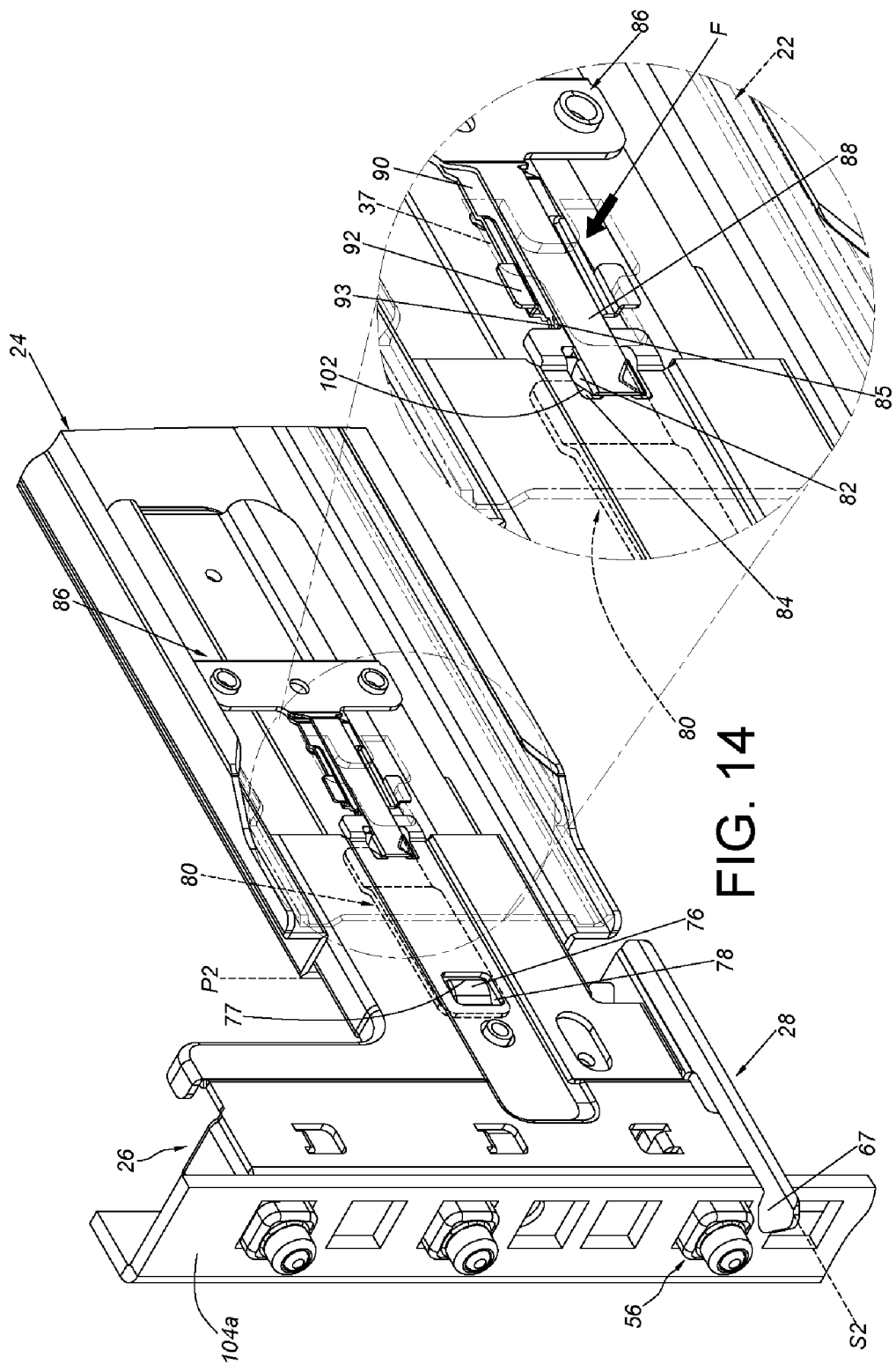
FIG. 14 is a schematic diagram showing the supporting member of the slide rail mechanism located at the second position relative to the first bracket in which the fastening member of the first bracket has fastened to the first post of the rack according to the embodiment of the present invention.

As shown in FIG. 13 and FIG. 14, the slide rail mechanism 20 can be mounted to a first post 104a of a rack through the at least one first mounting member 56 of the first bracket 26. The supporting member 24 is capable of moving from the first position P1 (shown in FIG. 13) to the second position P2 (shown in FIG. 14) along the first direction D1, and the supporting member 24 is capable of driving the fastening member 28 to change from the first state S1 (shown in FIG. 13) to the second state S2 (shown in FIG. 14), such that the fastening portion 67 of the fastening member 28 is enable to fasten to the first post 104a. The action principle that the supporting member 24 drives the fastening member 28 to change from the first state S1 to the second state S2 is recited above (FIG. 9 and FIG. 10) and is not repeated for the sake of conciseness.

As shown in FIG. 14, with the first structure 76 being engaged with the second structure 78 (the first lock mechanism) and the third structure 82 being engaged with the fourth structure 84 (the second lock mechanism), the supporting member 24 is capable of being kept at the second position P2 (which can refer to FIG. 10 and FIG. 12) relative to the first bracket 26. Accordingly, the reliability of the fasting member 28 in the second state S2 (such as the locking state) can be enhanced. Furthermore, with the arrangement, when the fastening portion 67 of the fastening member 28 is applied to fasten to the first post 104a of the rack, the security can be improved.

Figure 15:
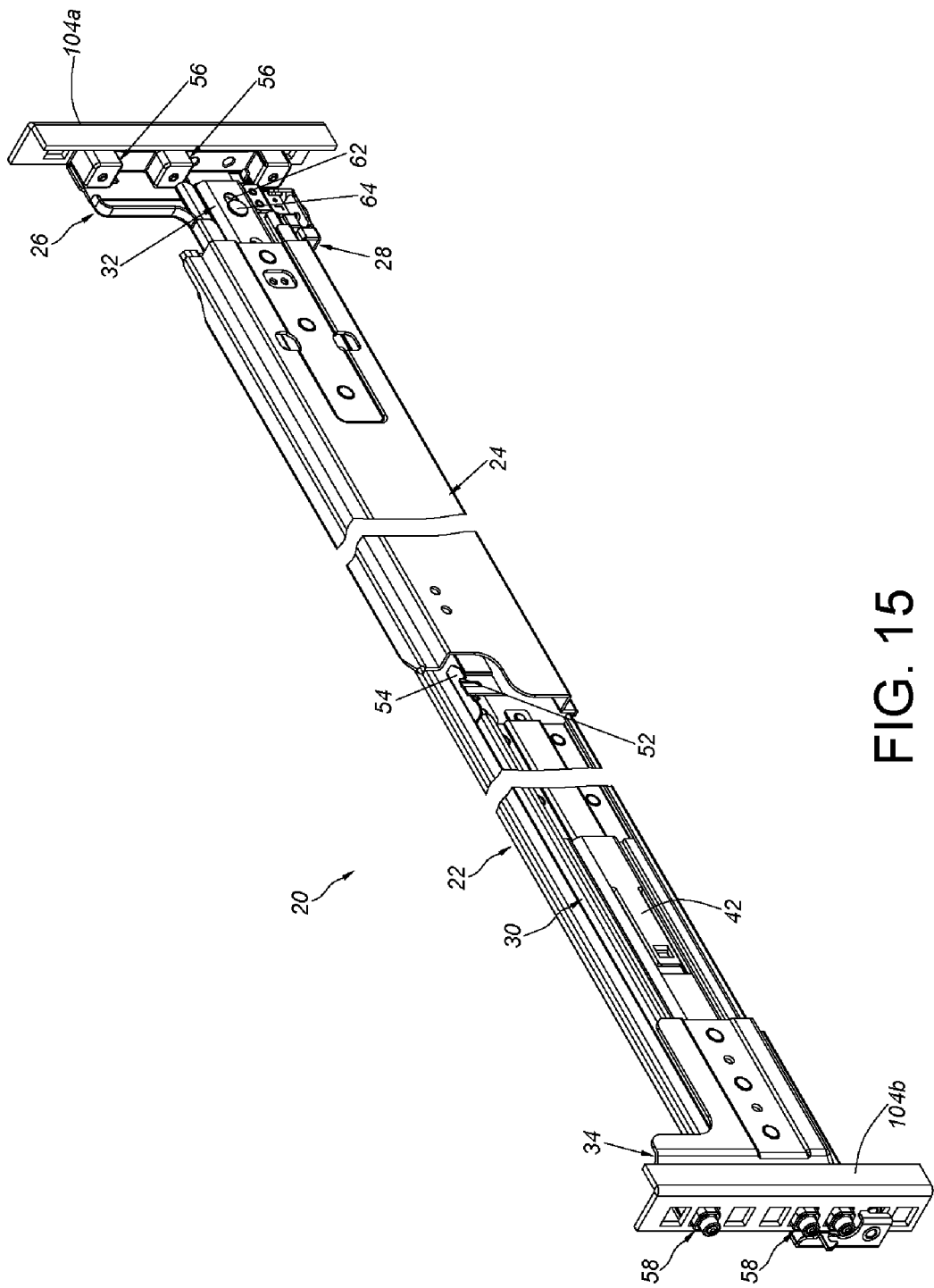
FIG. 15 is a schematic diagram showing the slide rail mechanism mounted to the first post and a second post according to the embodiment of the present invention.

As shown in FIG. 15, after the at least one first mounting member 56 of the first bracket 26 of the slide rail mechanism 20 being mounted to the first post 104a of the rack, and the fastening member 28 in the second state S2 fastening to the first post 104a, the slide rail mechanism 20 can be mounted to a second post 104b of the rack through the at least one second mounting member 58 of the second bracket 34.

To sum up, the slide rail mechanism 20 according to the embodiment of the present invention includes the following features.

First, the supporting member 24 wraps a portion of the rail member 22, which can enhance the structural strength between the first bracket 26 and the rail member 22.

Second, the supporting member 24 can be adjusted to move relative to the rail member 22 along the longitudinal direction, which allows the first bracket 26 to move a longer distance through the supporting member 24.

Third, the first bracket 26 and the supporting member 24 form a two-section bracket and is movable along the rail member 22, which is more suitable for racks with specific depth than the conventional three-section bracket.

Fourth, with cooperation between the first structure 76 and the second structure 78 (the first lock mechanism), or with cooperation between the third structure 82 and the fourth structure 84 (the second lock mechanism), the reliability of the fasting member 28 in the second state S2 (such as the locking state) can be enhanced when the supporting member 24 is located at the second position P2 relative to the first bracket 26.

Fifth, when the supporting member 24 is located at the first predetermined position X1, a first length A1 (shown in FIG. 1) is defined between the first bracket 26 and the second bracket 34. When the supporting member 24 is located at the second predetermined position X2, a second length A2 (shown in FIG. 2) is defined between the first bracket 26 and the second bracket 34. The second length A2 is longer than the first length A1. Therefore, the slide rail mechanism 20 can be adapted to two posts spaced by different distances of the rack.

Sixth, the slide rail mechanism 20 can be mounted to or detached from the rack by a single person who stands in front of the rack.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail mechanism, comprising:
   a rail member comprising an upper wall, a lower wall and a longitudinal wall connected between the upper wall and the lower wall;
   a supporting member, the supporting member and the rail member capable of moving relative to each other along a longitudinal direction, the supporting member comprising an upper supporting portion, a lower supporting portion and a longitudinal portion connected between the upper supporting portion and the lower supporting portion;
   a first bracket, the first bracket and the supporting member capable of moving relative to each other along the longitudinal direction; and
   a fastening member capable of being in one of a first state and a second state relative to the first bracket;
   wherein the upper supporting portion of the supporting member wraps a portion of the upper wall of the rail member, and the lower supporting portion of the supporting member wraps a portion of the lower wall of the rail member;
   wherein when the supporting member is moved from a first position to a second position relative to the first bracket, the supporting member is capable of driving the fastening member to change from the first state to the second state.

2. The slide rail mechanism of claim 1, wherein the longitudinal wall of the rail member has a first side, the slide rail mechanism further comprises a reinforcement member connected to the first side of the rail member.

3. The slide rail mechanism of claim 2, wherein the longitudinal wall of the rail member further has a second side opposite to the first side, and the slide rail mechanism further comprises a movable rail arranged at the second side of the rail member.

4. The slide rail mechanism of claim 2, further comprising:
a second bracket mounted to one of the reinforcement member and the rail member.

5. The slide rail mechanism of claim 2, wherein the reinforcement member comprises an upper edge wall, a lower edge wall and an extension wall connected between the upper edge wall and the lower edge wall, the reinforcement member is connected to the first side of the rail member through the extension wall.

6. The slide rail mechanism of claim 5, wherein the lower supporting portion of the supporting member has a first section and a second section, the first section is configured to support the lower wall of the rail member, the second section is bent relative to the first section, and the second section is extended to adjacent to a side of the lower wall of the rail member.

7. The slide rail mechanism of claim 6, wherein the upper supporting portion of the supporting member has a third section and a fourth section, the third section is configured to support the upper wall of the rail member, the fourth section is bent relative to the third section, and the fourth section is extended to adjacent to a side of the upper wall of the rail member.

8. The slide rail mechanism of claim 7, wherein the longitudinal portion and the lower supporting portion of the supporting member are connected through at least one first bend portion, and the longitudinal portion and the upper supporting portion of the supporting member are connected through at least one second bend portion.

9. The slide rail mechanism of claim 8, wherein the longitudinal portion, the at least one first bend portion and the at least one second bend portion of the supporting member together define a space, and a position of the reinforcement member is corresponding to the space.

10. The slide rail mechanism of claim 8, wherein one of the at least one first bend portion and the at least one second bend portion of the supporting member is configured to support the first side of the longitudinal wall of the rail member.

11. The slide rail mechanism of claim 1, wherein one of the supporting member and the rail member is arranged with a first block feature, the other one of the supporting member and the rail member is arranged with a second block feature, when the supporting member is moved from a first predetermined position to a second predetermined position relative to the rail member, the first block feature and the second block feature are capable of blocking each other.

12. The slide rail mechanism of claim 1, further comprising:
an auxiliary member connected to the supporting member, the first bracket being movably mounted to the auxiliary member.

13. The slide rail mechanism of claim 12, wherein one of the auxiliary member and the first bracket is arranged with a limiting feature, and the other one of the auxiliary member and the first bracket is arranged with a connection member passing through a portion of the limiting feature.

14. The slide rail mechanism of claim 12, wherein the auxiliary member is arranged with a first driving portion, when the supporting member is moved from the first position to the second position relative to the first bracket, the supporting member drives the fastening member to change from the first state to the second state through the first driving portion of the auxiliary member.

15. The slide rail mechanism of claim 14, wherein the auxiliary member is further arranged with a second driving portion, when the supporting member is moved from the second position to the first position relative to the first bracket, the supporting member drives the fastening member to recover from the second state to the first state through the second driving portion of the auxiliary member.

16. The slide rail mechanism of claim 1, wherein one of the supporting member and the first bracket is arranged with a first structure, the other one of the supporting member and the first bracket is arranged with a second structure, when the supporting member is located at the second position, the supporting member is capable of being kept at the second position through cooperation between the first structure and the second structure.

17. The slide rail mechanism of claim 16, wherein one of the supporting member and the first bracket is arranged with a third structure, the other one of the supporting member and the first bracket is arranged with a fourth structure, when the supporting member is located at the second position, the supporting member is capable of being kept at the second position through cooperation between the third structure and the fourth structure.

18. A slide rail mechanism, comprising:
a rail member;
a supporting member, the supporting member and the rail member capable of moving relative to each other along a longitudinal direction;
a first bracket, the first bracket and the supporting member capable of moving relative to each other along the longitudinal direction; and
a fastening member capable of being in one of a first state and a second state relative to the first bracket;
wherein one of the supporting member and the first bracket is arranged with a first structure, and the other one of the supporting member and the first bracket is arranged with a second structure;
wherein when the supporting member is moved from a first position to a second position relative to the first bracket, the supporting member is capable of being kept at the second position through cooperation between the first structure and the second structure.

19. The slide rail mechanism of claim 18, wherein the rail member comprises an upper wall, a lower wall and a longitudinal wall connected between the upper wall and the lower wall, the supporting member comprises an upper supporting portion, a lower supporting portion and a longitudinal portion connected between the upper supporting portion and the lower supporting portion, the upper supporting portion of the supporting member wraps a portion of the upper wall of the rail member, and the lower supporting portion of the supporting member wraps a portion of the lower wall of the rail member.

20. The slide rail mechanism of claim 18, wherein when the supporting member is moved from the first position to the second position relative to the first bracket, the supporting member is capable of driving the fastening member to change from the first state to the second state.

* * * * *